United States Patent [19]

Nguyen et al.

[11] Patent Number: 5,539,216

[45] Date of Patent: Jul. 23, 1996

[54] MONOLITHIC SEMICONDUCTOR BODY WITH CONVEX STRUCTURE

[75] Inventors: Bich-Yen Nguyen; Marius Orlowski; Philip J. Tobin; Jim Hayden; Jack Higman, all of Austin, Tex.

[73] Assignee: Motorola, Inc., Schaumburg, Ill.

[21] Appl. No.: 329,925

[22] Filed: Oct. 27, 1994

[51] Int. Cl.$^6$ .................. H01L 29/06; H01L 29/786; H01L 27/11

[52] U.S. Cl. ................ 257/67; 257/69; 257/74; 257/915

[58] Field of Search ................ 257/67, 69, 74, 257/915

[56] References Cited

U.S. PATENT DOCUMENTS

| | | |
|---|---|---|
| 4,609,407 | 9/1986 | Masao .................. 437/915 |
| 4,771,323 | 9/1988 | Sasaki .................. 257/69 |
| 4,806,201 | 2/1989 | Mitchell ................ 257/67 |
| 4,935,378 | 6/1990 | Mori .................... 437/43 |
| 5,019,879 | 5/1991 | Chiu .................... 257/321 |
| 5,021,848 | 6/1991 | Chiu .................... 257/321 |
| 5,063,172 | 11/1991 | Manley ................. 257/321 |
| 5,114,879 | 5/1992 | Madan .................. 437/195 |
| 5,308,445 | 5/1994 | Takasu ................. 437/915 |
| 5,414,277 | 5/1995 | Anzai .................. 257/69 |

*Primary Examiner*—Jerome Jackson
*Attorney, Agent, or Firm*—Jasper W. Dockrey

[57] ABSTRACT

A monolithic semiconductor body (26) resides in an opening (16) formed in an insulating layer (14). The monolithic semiconductor body (26) includes an elongated region (20) filling the opening (16) in the insulating layer (14) and contacting a semiconductor region (12). The monolithic semiconductor body (26) further includes a surface region (24) overlying the elongated region (20) and a portion of the surface (22) of the insulating layer (14) adjacent to the opening (16). The monolithic semiconductor body (26) is fabricated by first depositing a layer of semiconductor material into the opening (16), then planarizing the surface of the insulating layer (14). Next, a selective deposition process is carried out to form the surface region (24) using the semiconductor material in the opening (16) as a nucleation site. The radius of curvature of the surface region (24) is determined by the amount of controlled overgrowth during the selective deposition process.

10 Claims, 4 Drawing Sheets

5,539,216

MONOLITHIC SEMICONDUCTOR BODY WITH CONVEX STRUCTURE

FIELD OF THE INVENTION

This invention relates, in general, to semiconductor devices and to methods for fabricating semiconductor devices, and more particularly, to components of thin-film transistors and interconnect structures in multilayered semiconductor devices.

BACKGROUND OF THE INVENTION

There is a continuing trend in the semiconductor industry to fabricate integrated circuits of increasing complexity. In recent years, integrated circuit fabrication technology has achieved the ability to define circuit components having feature sizes in the sub-micron size range. For example, new lithographic techniques have been developed using X-ray and pulse-laser energy sources. Additionally, film deposition technology now exists which can form thin-film layers having a precisely determined chemical composition and thickness. Furthermore, thin-film etching techniques have been developed that are capable of selectively etching one thin-film composition, while not substantially etching other thin-film compositions present on the semiconductor substrate.

Integrated circuits that take advantage of the improved process capability can be fabricated in a substantially reduced amount of substrate area. However, even with the marked advanced in fabrication technology, achievement of the necessary packing density requires further development of component designs. In an effort to reduce substrate surface area requirements, circuit components are increasingly being fabricated in multiple stacked layers of patterned semiconductor material. The need to use advanced fabrication technology is especially important in view of the increased use of stacked semiconductor layers for the fabrication of complex integrated circuits.

A persistent problem in the fabrication of multiple, stacked layers is the creation of rough and uneven surface topography as each individual layer is formed. The lithographic and etching techniques commonly used to produce patterned semiconductor layers can produce features having sharp edges and corners. The sharp edges and corners contribute to severe topographical contrast as successive pattern semiconductor layers are formed upon one another. Severe topographical contrast can cause current leakage in metal-oxide-semiconductor (MOS) transistors as a result of dielectric thinning on the sharp edges. Additionally, the dielectric thinning over sharp edges can increase the capacitive coupling between the successive layers of patterned conductive or semiconductive material.

To overcome many of the problems associated with the fabrication of multi-layered semiconductor devices, planarization techniques are used to flatten the surface topography, and thereby avoid the propagation of severe surface contrast in overlying layers. Although planarization techniques are effective in reducing the propagation of severe surface contrast, leakage current problems continue to exist in MOS transistors fabricated in stacked layers of semiconductor material. Accordingly, further development of component designs utilizing advanced fabrication technology is necessary to provide improved interconnect structures and MOS transistors in multilayered semiconductor devices.

SUMMARY OF THE INVENTION

In practicing the present invention there is provided a monolithic semiconductor body, which includes an elongated region contacting a semiconductor region through an opening in an insulating layer. The monolithic semiconductor body further includes a surface region overlying the elongated region and overlying a portion of the insulating layer adjacent to the opening. The monolithic semiconductor body of the invention can be advantageously incorporated as a component of various semiconductor devices. In one embodiment, the monolithic semiconductor body of the invention functions as a thin-film gate electrode. A thin-film layer overlies the surface region and is separated therefrom by a gate dielectric layer. The channel region of the thin-film transistor is formed in the thin-film layer and overlies at least a portion of the surface region. In another embodiment, the monolithic semiconductor body of the invention functions as a component of an interconnect structure in an SRAM memory cell. The monolithic semiconductor body electrically interconnects thin-film load transistors to driver transistors, and provides cross coupling of two inverters employed in the SRAM memory cell.

The monolithic semiconductor body of the invention is preferably fabricated by first filling the opening in the insulating layer with a layer of semiconductor material, then planarizing the layer of semiconductor material to form a planar surface. A selective deposition process is then carried out to form the surface region of the semiconductor body, using the elongated region in the opening as a nucleation site. The radius of curvature of the surface region is determined by a controlled amount of overgrowth during the selective deposition process.

Figure 1:
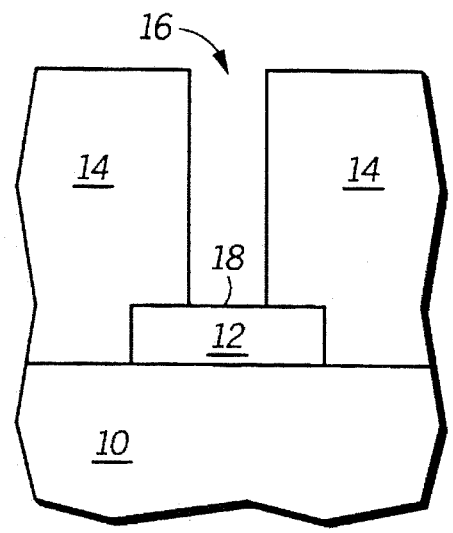
FIGS. 1–3 illustrate, in cross-section, process steps for the fabrication of a monolithic semiconductor body in accordance with the invention.

It will be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF PREFERRED EMBODIMENTS

The present invention is for a semiconductor structure and process in which a monolithic semiconductor body is formed in an opening of an insulating layer overlying a semiconductor region. The monolithic semiconductor body is preferably formed by a two-step process, which includes deposition and planarization to form a semiconductor region, followed by a selective deposition process using the semiconductor region as a nucleating surface for the selective deposition process. The selective deposition process forms a monolithic semiconductor body, which can be utilized as a portion of an interconnect structure, a portion of a flat panel display, or a thin-film gate electrode, or the like. In any of the foregoing implementations, the selective deposition process provides a monolithic semiconductor body that is self-aligned to the opening in the insulating layer.

By restricting the dimensions of the monolithic semiconductor body to the immediate area of the opening in the insulating layer, semiconductor devices incorporating the structure and process of the present invention can be made smaller and with fewer lithographic alignment errors. Furthermore, because the monolithic semiconductor body is self-aligned to the opening, the monolithic semiconductor body can be fabricated with a minimal number of processing steps. The advantages of the present invention and the relationship of the monolithic semiconductor body to the construction of an improved semiconductor device will be better understood following a description of a preferred fabrication process.

Shown in FIG. 1 is a portion of a semiconductor substrate 10 having already undergone several process steps in accordance with the invention. A semiconductor region 12 overlies a portion of substrate 10. Semiconductor region 12 is preferably a patterned layer of polycrystalline silicon deposited onto semiconductor substrate 10 by a chemical vapor deposition process. The polycrystalline silicon layer is subsequently patterned by applying a lithographic mask and performing an anisotropic etching process. Semiconductor region 12 can have various functions depending upon the type of semiconductor device being fabricated. For example, semiconductor region 12 can be a gate electrode of an MOS transistor. Alternatively, semiconductor region 12 can be a portion of a polycrystalline interconnect structure overlying the surface of substrate 10 and electrically coupling various components (not shown) of an integrated circuit. Additionally, semiconductor region 12 can be a base portion of a flat panel display, or the like. Furthermore, in another embodiment of the invention, semiconductor region 12 can be a doped region (not shown) in a semiconductor substrate.

An insulating layer 14 overlies the surface of substrate 10 and semiconductor region 12. An opening 16 in insulating layer 14 exposes a surface portion 18 of semiconductor region 12. Insulating layer 14 can be any dielectric material that can be formed as a thin-film layer on a semiconductor substrate. For example, insulating layer 14 can be silicon dioxide deposited by a chemical vapor deposition process. Furthermore, insulating layer 14 can be a chemical vapor deposited silicon dioxide containing a dopant species such as phosphorous or boron, or both. Additionally, insulating layer 14 can be a spin-on-glass (SOG) layer, or a passivation layer deposited in an atmospheric deposition system, or the like. Preferably insulating layer 14 is silicon dioxide deposited by a chemical vapor deposition using tetraethylorthosilane (TEOS) source gas. Opening 16 is preferably formed by defining a lithographic pattern on insulating layer 14, then carrying out a reactive ion etching process to anisotropically etch insulating layer 14. As illustrated in FIG. 1, the anisotropic etching process creates an opening having a substantially vertical wall surface.

Figure 2:
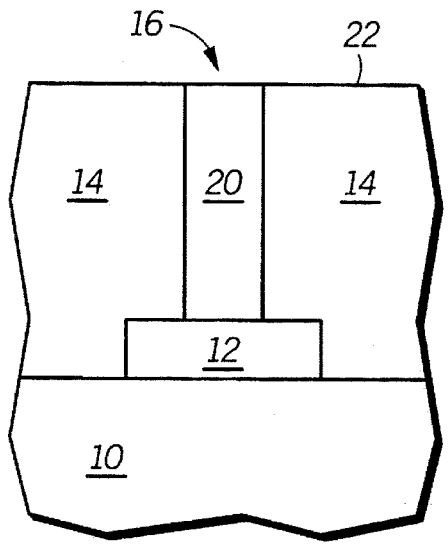

After forming opening 16, an elongated region 20 is formed in opening 16, as illustrated in FIG. 2. Elongated region 20 is preferably formed by depositing a layer of polycrystalline silicon overlying insulating layer 14 and filling opening 16. During the deposition process, polycrystalline silicon deposited into opening 16 forms a metallurgical contact to semiconductor region 12. Preferably, a conductivity determining dopant species is added to the reactive gases in the chemical vapor deposition process to dope the polycrystalline silicon during the deposition process.

Once the polycrystalline silicon deposition process is complete, a planar surface 22 is formed. Preferably, planar surface 22 is formed by a chemical-mechanical-polishing (CMP) process in which both polycrystalline silicon and material from insulating layer 14 are removed at substantially the same rate. The non-selective CMP process polishes back the materials to form a smooth surface. Alternatively, planar surface 22 can be formed by a non-selective etching process, such as ion milling, reactive sputter etching, and the like.

Figure 3:
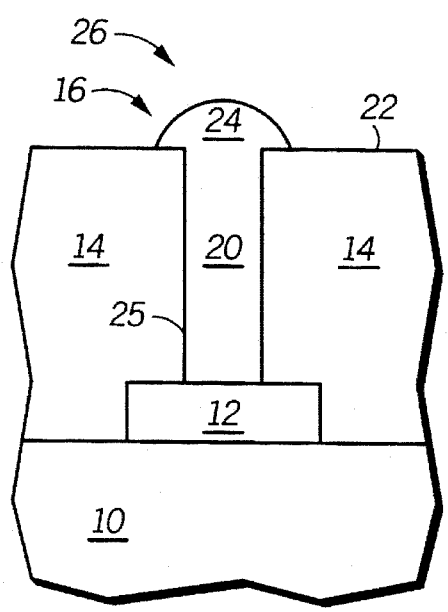

Referring to FIG. 3, the inventive process continues with the fabrication of a surface region 24 overlying elongated region 20, and also overlying a portion of insulating layer 14 adjacent to opening 16. Preferably, surface region 24 is formed by a selective deposition process. In the selective deposition process, the deposition reaction is adjusted so that the polycrystalline silicon is deposited only on exposed silicon, either polycrystalline silicon or monocrystalline silicon. The exposed silicon acts as a nucleation site for the selective deposition process. In the present embodiment, the upper surface of elongated region 20 provides a nucleation site. Once the selected deposition process begins on the nucleation site, the selectively deposited polysilicon itself acts as a nucleation site so that the reaction continues to deposit successive layers of polycrystalline silicon.

The selectively deposited silicon does not otherwise deposit on insulating materials, such as insulating layer 14. However, because of a phenomenon known as "overgrowth" the selectively deposited silicon can extend over regions of an insulating layer in proximity to the original nucleation site. The present invention incorporates overgrowth of the selectively deposited polycrystalline silicon to form surface region 24 having a generally convex upper surface. The process parameters of the selective deposition process are controlled in such a manner and for an extended period of time sufficient to form an overgrowth onto a portion of planar surface 22 adjacent to elongated region 20.

Preferably, the selectively deposited polycrystalline silicon is doped with boron during the selective deposition process. In a preferred embodiment, a silane gas, hydrogen chloride, and hydrogen are introduced into a selective deposition reactor, which is maintained at a temperature of about 800° to 900° C. A boron containing gas such as diborane, and the like, is also introduced and a deposition pressure of about 30 to 50 torr is maintained.

Under the foregoing conditions, the overgrowth of the selectively deposited polycrystalline silicon can be controlled to obtain a precisely defined surface region overlying elongated region 20. The surface region, formed in accordance with the invention, is preferably a smooth, isoplanar semiconductor body having a resistivity of about 50 to 500 ohms. The use of elongated region 20 as a nucleation site bonds surface region 24 to elongated region 20, such that a monolithic semiconductor body 26 is formed. Accordingly, the selective deposition process forms a continuous polycrystalline silicon body having a substantially uniform grain size and uniform electrical conductivity.

Although, the structural morphology of surface region 24 is preferably of a uniform grain size and characterized by a smooth surface, crystalline planes can sometimes form during deposition resulting in facets on the polycrystalline surface. The facets can distort the surface to an extent that a smooth curvature is not realized. In extreme cases, the surface region can appear trapaziodal, or pyramidal, or the like. Accordingly, as used herein the term "generally convex" contemplates such other geometric features created by faceting of the selectively deposited polycrystalline silicon. Additionally, since the plane geometry of elongated region 20 is dependent on the plane geometry of the opening formed in the insulating layer, surface region 24 can have a generally square or rectangular plane geometry.

As illustrated in FIG. 3, monolithic semiconductor body 26 begins at a metallurgical contact 25 with semiconductor region 12, and extends through opening 16 to overlie a portion of planar surface 22. Those skilled in the art will recognize that monolithic semiconductor body 26 can be utilized as a portion of an interconnect structure, in which surface region 24 forms a contact site for the connection of overlying electrically conductive leads. Additionally, as will subsequently be described, monolithic semiconductor body 26 can be utilized as a thin-film gate electrode in a memory device, or a logic device, or the like.

Figure 4:
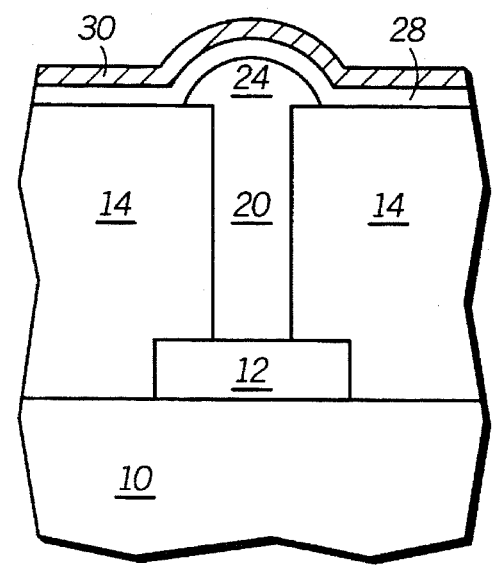
FIGS. 4–6 illustrate, in cross-section, process steps for the fabrication of a thin-film transistor in accordance with the invention.
Figure 5:
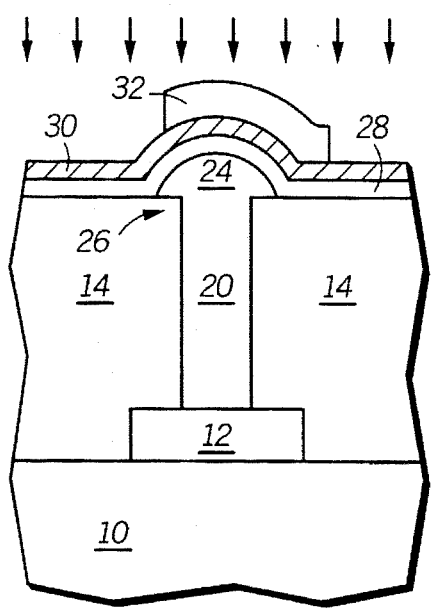
Figure 6:
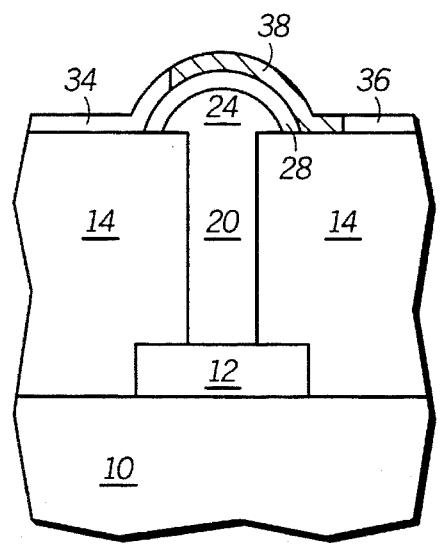

FIGS. 4–6 illustrate process steps for the fabrication of a thin-film transistor using monolithic semiconductor body 26 as a thin-film gate electrode. To begin the fabrication of a thin-film transistor, a gate dielectric layer 28 is deposited to overlie surface region 24 and insulating layer 14. Preferably, gate dielectric layer 28 is deposited by a chemical vapor deposition process using TEOS source gas. Next, a thin-film layer 30 is deposited to overlie gate dielectric layer 28. Preferably, thin-film layer 30 is a polycrystalline silicon layer deposited by a two-step chemical vapor deposition process. In the first deposition step, an amorphous polycrystalline silicon layer is deposited to form a thin-film layer having a thickness of about 100 to 600 angstroms. After the first deposition step, any ion implantation and lithographic patterning process steps can be carried out to complete the fabrication of other components commonly present in an integrated circuit device.

After forming thin-film layer 30, a lithographic mask 32 is formed to overlie a portion of thin-film layer 30, as illustrated in FIG. 5. Lithographic mask 32 is positioned to overlie a region of thin-film layer 30 substantially residing over surface region 24 of monolithic semiconductor body 26. Lithographic mask 32 can be a photolithographic material, such as a novalak resin containing a photosensitizer, a deep UV masking material, an x-ray absorbing material, and the like.

Once lithographic mask 32 is defined, a doping step is carried out to dope regions of thin-film layer 30 not protected by lithographic mask 32. The doping step is preferably carried out by ion implanting a conductivity-determining dopant species, such as boron, phosphorus, arsenic, and the like, into thin-film layer 30. In a preferred embodiment for the fabrication of a thin-film transistor, a P-type transistor is fabricated by implanting boron ions into the regions of thin-film layer 30 not protected by lithographic mask 32.

As illustrated in FIG. 6, the ion implantation process forms source and drain regions 34 and 36, respectively. A thin-film channel region 38 resides between source and drain regions 34 and 36 and overlies a portion of surface region 24. Thin-film channel region 38 also overlies a portion of insulating layer 14 adjacent to surface region 24. The foregoing lithographic patterning and ion implantation steps result in the formation of an off-set drain structure. The off-set drain region 36 is spaced away from the gate electrode of the thin-film transistor by a portion of the thin-film channel region 38. The off-set drain structure improves the performance of the thin-film transistor by maintaining the off-state current at a low level, which reduces leakage current from the transistor.

Those skilled in the art will appreciate that the active channel region is defined by the radius of curvature of surface region 24. Accordingly, the effective channel length of the thin-film transistor is determined, in part, by the extent of overgrowth during the selective deposition process used to form surface region 24. The overall dimensions of the gate-control portion of thin-film channel region 38 is determined by the characteristics of the selective deposition process, rather than by a lithographic alignment process. The enlargement of the surface area of the thin-film gate electrode reduces alignment errors in a lithographic process operating at the lower limit of its feature definition capability.

The foregoing process enables the fabrication of thin-film transistors having a gate electrode that is not limited by lithographic alignment capability. By eliminating the use of a lithographic step for gate electrode definition, the thin-film transistor can be fabricated to exceedingly small dimensions. As illustrated in the preferred embodiment of the invention, the single lithographic step used to define the source and drain regions can have a lateral dimension exceeding that of the thin-film gate electrode. However, the extended lateral dimension of the lithographic pattern improves rather than limits the performance of the thin-film transistor. Furthermore, the thin-film gate electrode illustrated in FIG. 6 can be precisely aligned to an opening in an insulating film. The formation of a thin-film gate electrode self-aligned to an opening in an insulating layer alleviates problems of the prior art associated with lithographic misalignment.

In a further embodiment of the invention, an SRAM memory cell is fabricated as illustrated in FIGS. 7–10. Shown in FIG. 7, in plan view, is a layout of an SRAM memory cell at a point in the fabrication process following the formation of driver transistors and word lines. In the SRAM cell layout shown in FIG. 7, a pair of driver gate electrodes 40 and 41 overlie portions of first and second active regions 42 and 43, respectively. A driver transistor 44 resides in active region 42 where driver gate electrode 40 overlies active region 42. Correspondingly, a driver transistor 45 resides in active region 43 at a location where driver gate electrode 41 overlies active region 43. A pair of word lines 46 and 47 overlie active regions 42 and 43, respectively. Access transistors 48 and 49 reside in active regions 42 and 43 at locations where word lines 46 and 47 overlie active regions 42 and 43. An insulating layer 50 overlies the driver and access transistors and contains a plurality of openings 51, 53, 55, and 57.

Figure 7:
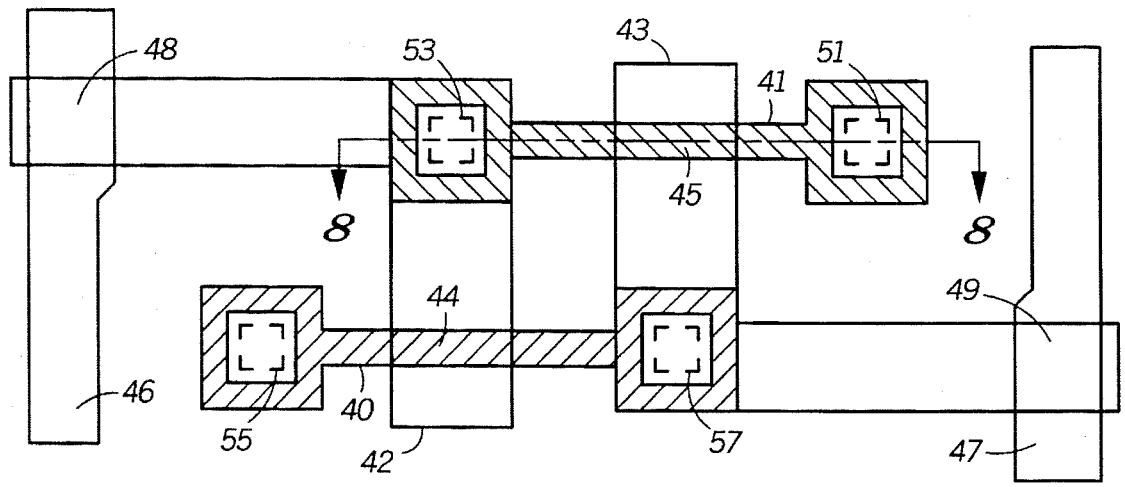
FIG. 7 illustrates, in plan view, the layout of the first layer of an SRAM memory cell formed in accordance with the invention.
Figure 8:
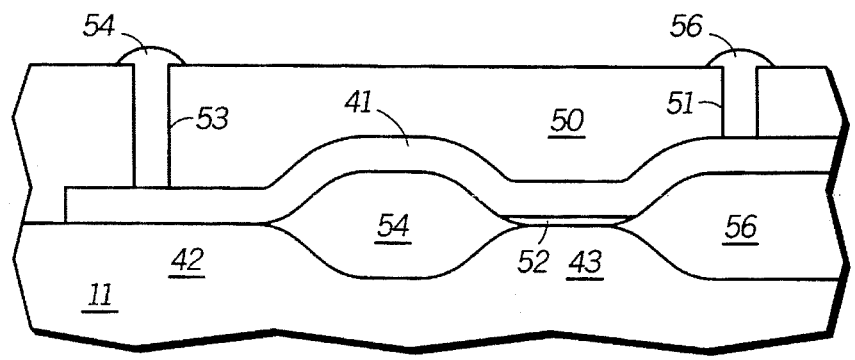
FIG. 8 illustrates, in cross-section, a portion of the SRAM memory cell illustrated in FIG. 7 taken along Section line 8—8.

FIG. 8 illustrates a cross-sectional view of the SRAM memory cell shown in FIG. 7 taken along section line 8—8.

As illustrated in FIG. 8, driver gate electrode 41 overlies active regions 42 and 43, and is separated from active region 43 by a gate dielectric layer 52. A first field oxide region 54 separates active region 42 from active region 43. A second field oxide region 56 resides in substrate 11 and defines the lateral extent of active region 43. Two monolithic semiconductor bodies 54 and 56, formed in accordance with the invention, reside in openings 53 and 51, respectively, and contact portions of driver gate electrode 41. In the present embodiment, monolithic semiconductor body 54 functions as a thin-film gate electrode, while monolithic semiconductor body 56 functions as an element of an interconnect for cross-coupling the SRAM memory cell.

In the present embodiment, once driver gate electrode 41 is defined, insulating layer 50 is deposited to overlie driver gate electrode 41 and openings 51, 53, 55, and 57 are formed therein. Then, a layer of polycrystalline silicon (not shown) is deposited to overlie insulating layer 50 and to fill the openings. Next, the structure is planarized and the previously described selective polycrystalline silicon deposition process is carried out to complete the formation of monolithic semiconductor bodies 54 and 56. As will subsequently be described, the selective deposition process results in the precise placement of a thin-film gate electrode and a connecting portion of a cross-coupling interconnect for the SRAM memory cell.

Figure 9:
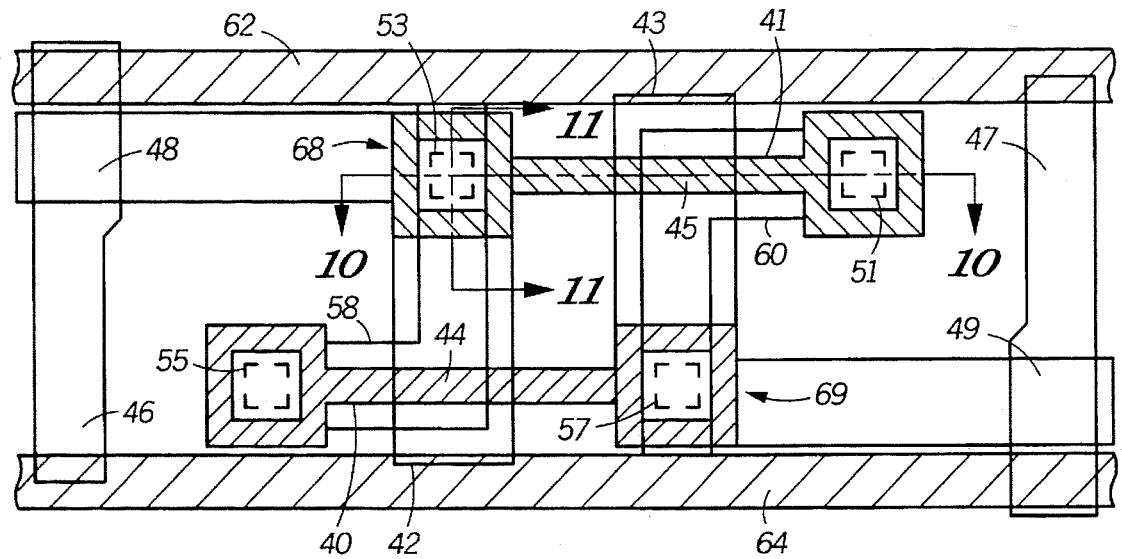
FIG. 9 illustrates, in plan view, the layout of the SRAM memory cell of FIG. 7 having a second layer containing thin-film load transistors and VCC lines in place.

FIG. 9 shows, in plan view, the SRAM memory cell layout having thin-film load transistors and $V_{CC}$ supply lines in place. A pair of "L" shaped thin-film layers 58 and 60 overlie insulating layer 50 over portions of active regions 42 and 43, respectively. Thin-film layer 58 is coupled to a $V_{CC}$ line 62 at a location adjacent to opening 53. Similarly, thin-film layer 60 is coupled to a $V_{CC}$ line 64 at a location adjacent to opening 57.

Figure 10:
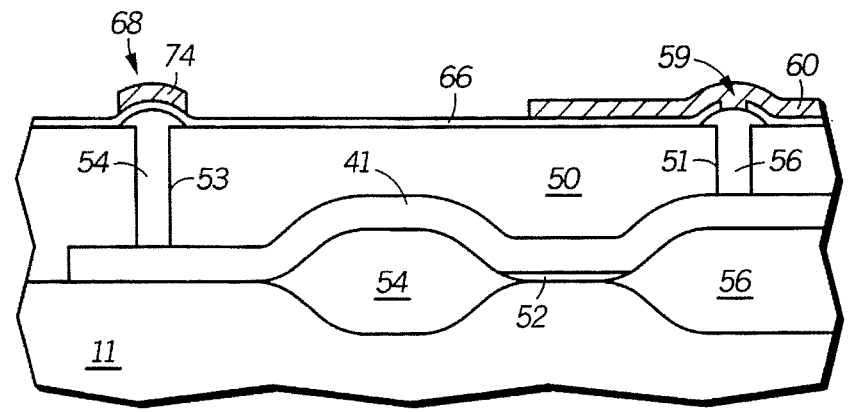
FIG. 10 illustrates, in cross-section, a portion of the SRAM memory cell shown in FIG. 9 taken along Section line 10—10.

FIG. 10 illustrates a cross sectional view of the SRAM memory cell shown in FIG. 9 taken along Section line 10—10. Thin-film layer 60 is coupled to monolithic semiconductor body 56 through an opening 59 in a gate dielectric layer 66. Thin-film layer 60 also forms the channel portion of a thin-film transistor 69 overlying opening 57. Thin-film layer 58 forms a thin-film channel region 74 for a thin-film transistor 68 overlying opening 53. Gate dielectric layer 66 overlies insulating layer 50 and separates thin-film channel region 74 from monolithic semiconductor body 54. Monolithic semiconductor body 54 forms a thin-film gate electrode for a thin-film transistor 68.

Figure 11:
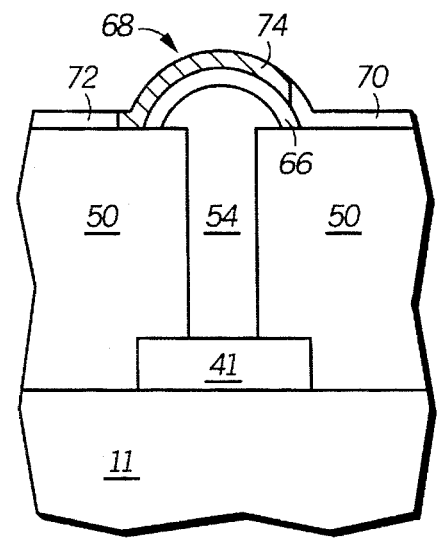
FIG. 11 illustrates, in cross-section, a portion of the SRAM memory cell shown in FIG. 9 taken along Section line 11—11.

FIG. 11 illustrates a cross sectional view of the SRAM memory cell shown in FIG. 9 taken along Section line 11—11. The functional portions of thin-film transistor 68 are illustrated in FIG. 11. Source and drain regions 70 and 72 are formed in thin-film layer 58 using the previously described lithographic and ion implantation process. Source and drain regions 70 and 72 are separated by thin-film channel region 74 overlying monolithic semiconductor body 54 and separated therefrom by gate dielectric layer 66. Thin-film transistor 69, shown in FIG. 9, is formed in a manner similar to thin-film transistor 68.

Those skilled in the art will appreciate that the SRAM memory cell illustrated in FIGS. 9–11 can be fabricated in a minimal amount of substrate surface area. The incorporation of monolithic semiconductor bodies fabricated with the inventive process provides an SRAM memory cell having a compact layout. Additionally, the selective deposition process used to form the thin-film gate electrodes and portions of the interconnect structures increases device reliability and reduces process complexity. Because the thin-film gate electrodes and portions of the interconnect structure are self-aligned to openings formed in an insulating layer, an SRAM cell can be fabricated with a reduced number of lithographic processing steps.

Figure 12:
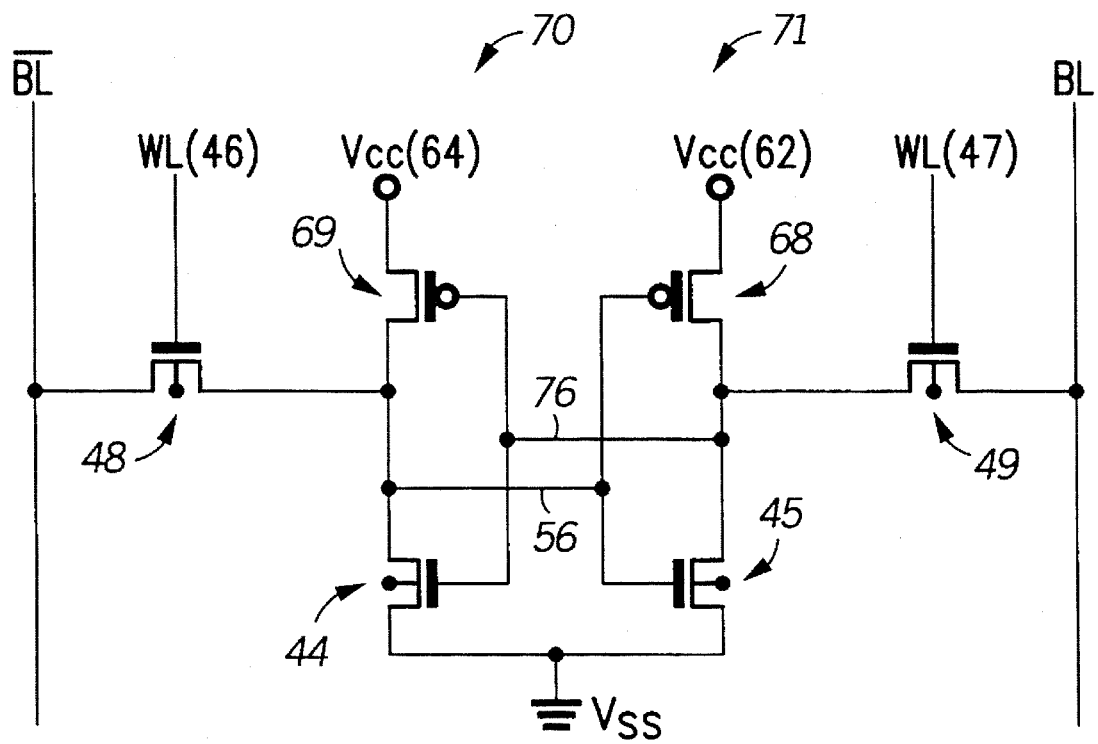
FIG. 12 is a schematic diagram of an SRAM memory cell illustrating the interconnection of the device components fabricated in accordance with the invention.

A schematic circuit diagram of the SRAM memory cell fabricated in accordance with the invention is illustrated in FIG. 12. Referring to FIGS. 9 and 12, two cross-coupled inverters 70 and 71 provide the central memory storage circuitry for the SRAM memory cell. Inverter 70 includes thin-film transistor 69 coupled to driver transistor 44. Correspondingly, inverter 71 includes thin-film transistor 68 coupled to driver transistor 45. Bit line access to inverter 70 and 71 is controlled by access transistors 49 and 48, respectively. Word line 47 provides gate control to access transistor 49, and word line 46 provides gate control to access transistor 48. $V_{CC}$ line 62 is coupled to thin-film layer 58 providing a $V_{CC}$ signal to thin-film transistor 68. Correspondingly, $V_{CC}$ line 64 is coupled to thin-film layer 60 to provide a $V_{CC}$ signal to thin-film transistor 69.

The portion of the cross coupled interconnect structure supplied by monolithic semiconductor body 56 is shown in the schematic diagram of FIG. 12. Monolithic semiconductor body 56 interconnects inverter 70 and 71 by providing an electrical path between the thin-film channel region of thin-film transistor 69 and the driver gate electrode of driver transistor 45. Similarly, monolithic semiconductor body 76 electrically couples the thin-film layer of thin-film transistor 68 to the driver gate electrode of driver transistor 44.

Thus it is apparent that there has been provided, in accordance with the invention, a monolithic semiconductor body and process which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the monolithic semiconductor body of the invention can be incorporated into additional circuit elements, such as J–K flip-flops, NOR gates, NAND gates, and the like. Furthermore, multichambered cluster tools, and the like, can be used for thin-film deposition and etching. It is therefore intended to include within the invention all such variations and modifications as fall within the scope of the appended claims and equivalents thereof.

We claim:

1. A semiconductor device comprising:

a thin-film gate electrode having a generally convex upper surface, wherein the convex upper surface is characterized by a rising edge and a falling edge and an apex at a point where the rising edge meets the falling edge;

a thin-film layer overlying the apex and separated therefrom by a gate dielectric layer;

source and drain regions in the thin-film layer and separated by a channel region therebetween, wherein the channel region overlies at least a portion of the convex upper surface;

an insulating layer underlying the thin-film gate electrode; and an opening in an insulation layer subtending the apex.

2. The device of claim 1 further comprising:

a semiconductor region underlying the insulating layer; and a semiconductor layer filling the opening and connecting the thin-film gate electrode to the semiconductor region.

3. The device of claim 2, wherein the channel region extends away from the convex upper surface and overlies a portion of the insulating layer adjacent to the convex upper surface, and wherein the drain region overlies the insulating layer.

4. The device of claim 2, wherein the semiconductor region is a patterned layer of polycrystalline silicon.

5. The device of claim 2, wherein the semiconductor region is a semiconductor substrate.

6. A semiconductor device comprising:

a semiconductor region;

an insulating layer overlying the semiconductor region, the insulating layer having an opening therein, wherein the opening exposes a portion of the semiconductor region: and a monolithic semiconductor body including, an elongated region contacting the semiconductor region and filling the opening, and including a surface region overlying the elongated region and overlying a portion of the insulating layer adjacent to the opening, wherein the monolithic semiconductor body is polycrystalline silicon, wherein the surface region has a generally convex upper surface characterized by a rising edge and a falling edge and an apex at a point where the rising edge meet the falling edge, and wherein the opening subtends the apex.

7. The device of claim 6, wherein the semiconductor region is a patterned layer of polycrystalline silicon.

8. A semiconductor device comprising:

a driver gate electrode;

an insulating layer overlying the driver gate electrode and having first and second openings therein, wherein the first and second openings each expose first and second portions of the driver gate electrode, respectively;

a thin-film gate electrode filling the first opening and overlying a portion of the insulating layer, wherein the thin-film gate electrode has a convex upper surface characterized by a rising edge and a falling edge and a first apex at a point where the rising edge meets the falling edge, and wherein the first opening subtends the first apex;

an interconnect structure filling the second opening and overlying a portion of the insulating layer, wherein the interconnect structure has a convex upper surface characterized by a rising edge and a falling edge and a second apex at a point where the rising edge meets the falling edge, and wherein the second opening subtends the second apex;

a dielectric layer overlying the thin-film gate electrode and the interconnect structure, the dielectric layer having an opening exposing a portion of the convex upper surface of the interconnect structure; and a thin-film layer overlying the dielectric layer and forming a channel region over the thin-film gate electrode and contacting the interconnect structure through the opening in the dielectric layer.

9. The device of claim 8 further comprising source and drain regions in the thin-film layer and separated by the channel region therebetween.

10. The device of claim 9, wherein the channel region extends away from the convex upper surface of the thin-film gate electrode and overlies a portion of the insulating layer adjacent to the convex upper surface, and wherein the drain region overlies the insulating layer and is spaced away from the thin-film gate electrode by the channel region.

* * * * *